United States Patent
Tang

(10) Patent No.: US 8,031,516 B2
(45) Date of Patent: Oct. 4, 2011

(54) WRITING MEMORY CELLS EXHIBITING THRESHOLD SWITCH BEHAVIOR

(76) Inventor: Stephen Tang, Fremont, CA (US)

( * ) Notice: Subject to any disclaimer, the term of this patent is extended or adjusted under 35 U.S.C. 154(b) by 147 days.

(21) Appl. No.: 12/333,518

(22) Filed: Dec. 12, 2008

(65) Prior Publication Data

US 2010/0149856 A1    Jun. 17, 2010

(51) Int. Cl.
    *G11C 11/00*    (2006.01)
(52) U.S. Cl. .............. 365/163; 365/189.16; 365/207
(58) Field of Classification Search .......... 365/163, 365/113, 189.16, 207
See application file for complete search history.

(56) References Cited

U.S. PATENT DOCUMENTS

| | | | |
|---|---|---|---|
| 6,487,113 B1 * | 11/2002 | Park et al. | 365/163 |
| 6,667,900 B2 * | 12/2003 | Lowrey et al. | 365/171 |
| 6,768,665 B2 * | 7/2004 | Parkinson et al. | 365/113 |
| 6,859,390 B2 * | 2/2005 | Pashmakov | 365/163 |
| 7,050,328 B2 * | 5/2006 | Khouri et al. | 365/163 |
| 7,324,371 B2 * | 1/2008 | Khouri et al. | 365/163 |
| 2006/0181931 A1 * | 8/2006 | Ha et al. | 365/185.23 |
| 2007/0115749 A1 * | 5/2007 | Gilbert | 365/230.01 |
| 2009/0103365 A1 * | 4/2009 | Roohparvar et al. | 365/185.17 |

\* cited by examiner

*Primary Examiner* — Gene N. Auduong
(74) *Attorney, Agent, or Firm* — Trop, Pruner & Hu, P.C.

(57) ABSTRACT

A memory cell exhibiting threshold switch behavior, such as a phase change memory, can be programmed in a way that eliminates the need for a separate post-programming verification cycle. In particular, a circuit can be used to apply the programming pulse to a cell in a way that determines whether the cell has reached the desired threshold voltage. If the cell has not reached the desired threshold voltage, it receives another programming pulse. If it has, it does not receive another programming pulse. Thus, by applying a voltage across the cell that never exceeds the threshold voltage of the cell, the need for a separate verification cycle can be eliminated in some embodiments.

23 Claims, 2 Drawing Sheets

WRITING MEMORY CELLS EXHIBITING THRESHOLD SWITCH BEHAVIOR

BACKGROUND

This relates generally to memories, such as phase change memories, that exhibit threshold switch behavior.

Threshold switch behavior is the tendency of an element to discontinuously change its current voltage characteristics upon exceeding a threshold voltage. For example, a phase change memory may have set and reset states with different threshold voltages.

Due to variation of cells within a product, different cells may require different levels of programming current to reach the same threshold voltage. Thus, after programming, a verify may be used to ensure that the threshold voltage of each cell has been programmed above the level required to yield an adequate read window.

DETAILED DESCRIPTION

Figure 5:
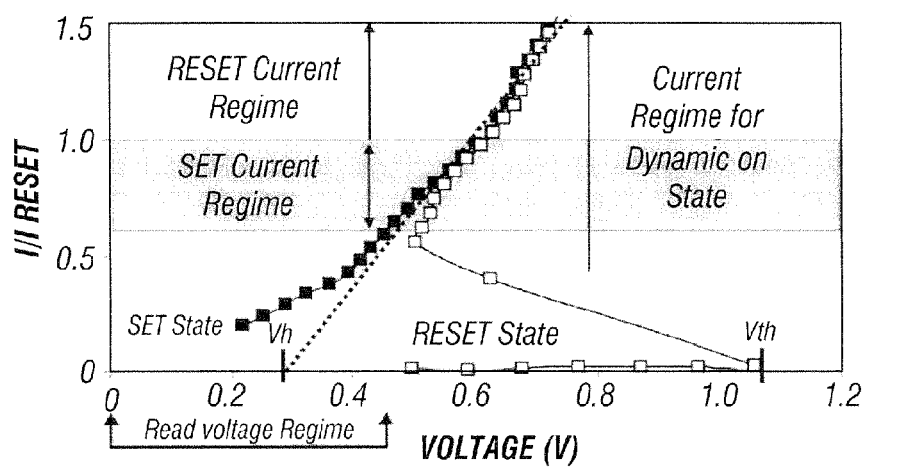
FIG. 5 is a normalized current versus voltage curve for exemplary memory cell according to one embodiment.

Electronic threshold switches are devices whose current voltage (iv) characteristics have a shape similar to that shown in FIG. 5. Starting from an off state, very little current flows as the voltage is applied until the threshold voltage $V_{th}$ is reached. At this point, the device snaps back and latches to an on state that is much more conductive. A common semiconductor device that exhibits this behavior is a thyristor. Another example is a phase change memory cell whose current voltage curve is shown in FIG. 5.

The phase change memory cell whose iv curve is shown in FIG. 5 is a threshold switch whose threshold voltage can be programmed and retained. In the crystalline or set state, indicated by blackened squares in FIG. 5, some phase change memories have zero threshold voltage, meaning that they exhibit no thresholding behavior and proceed immediately into the conductive state. In the amorphous, or reset state, indicated by the open squares in FIG. 5, the threshold voltage typically depends on how much current was applied during the programming pulse that placed the cell in the reset state. The current during programming may be in the reset current regime, indicated in FIG. 5. Higher programming current leads to higher threshold voltage, up to a saturation point.

If only a fixed programming current is provided, some cells program adequately, but others do not. Providing a high fixed programming current may cause cells that do not require such high current to wear out faster.

In one embodiment, the maximum voltage available during programming is limited to a level below the desired reset threshold voltage. Cells whose reset threshold voltage already exceed this threshold voltage do not threshold or receive another programming pulse. In effect, verification is completed before programming is done and only cells that do not verify during programming receive one or more additional programming pulses.

Figure 1:
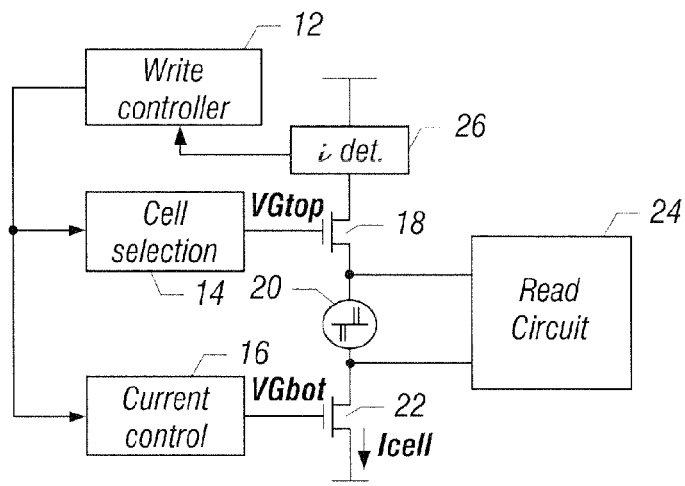
FIG. 1 is a schematic diagram for one embodiment of the present invention.

In FIG. 1, the cell 20 may be a phase change memory cell or any other electronic threshold switch. In one embodiment, it may be a series combination of a phase change memory element and one or more select devices, such as thin film selectors including chalcogenide threshold switches (sometimes called ovonic threshold switches), that normally remain in the amorphous state, and silicon diodes. The cell 20 is coupled to a transistor 18 whose gate is connected to a cell selection block 14. Thus, the cell selection block 14 outputs a signal VGtop, which drives the gate of the top transistor 18. The drain of the transistor 18 is coupled to a supply voltage and its source is coupled to the cell 20.

A current control block 16 outputs the signal VGbot, which supplies the gate voltage to a bottom transistor 22 whose drain is coupled to the cell 20 and whose source is coupled to ground. The output current from the source of the transistor 22 is the current $I_{cell}$.

The cell selection block 14 and the current control block 16 are driven by a write controller 12. Thus, the write controller 12 controls the cell selection block 14 and the current control block 16. The net effect of this control is to control the voltage across the cell 20. Thus, the write controller 12 can control the voltage across the cell 20 to control programming in a programming mode.

The write controller 12 can also turn off the transistors 18 and 22 to enter a read mode. In a read mode, the read circuit 24, which may include a sense amplifier, detects the state of the cell 20 which typically is either set or reset. However, multilevel cells may also be used.

In some embodiments, a current detector 26 may be used to shorten the programming cycle when possible.

In one embodiment, the transistor 18 is biased as a source follower so that its source is an offset version of its gate voltage. The transistor 22 may be biased as a current mirror, so that its gate voltage translates to programming current $I_{cell}$. If the threshold voltage of the cell 20 is below the source voltage of the source follower transistor 18, the cell 20 thresholds, conducts current and, as a result, receives a programming pulse whose current is determined by the current mirror transistor 22.

Figure 2:
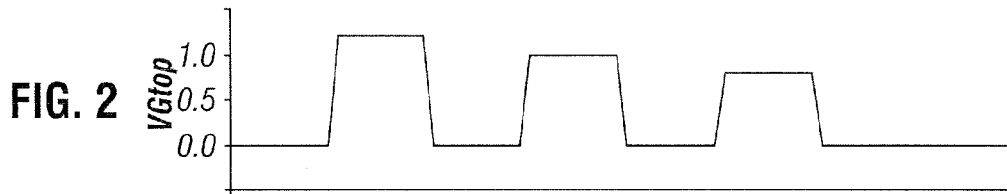
FIG. 2 is a graph of a gate voltage of a transistor over a memory cell versus time according to one embodiment.
Figure 3:
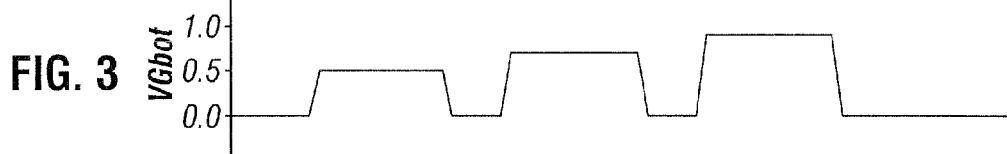
FIG. 3 is a graph of a gate voltage of a transistor under the memory cell versus time in accordance with one embodiment.
Figure 4:
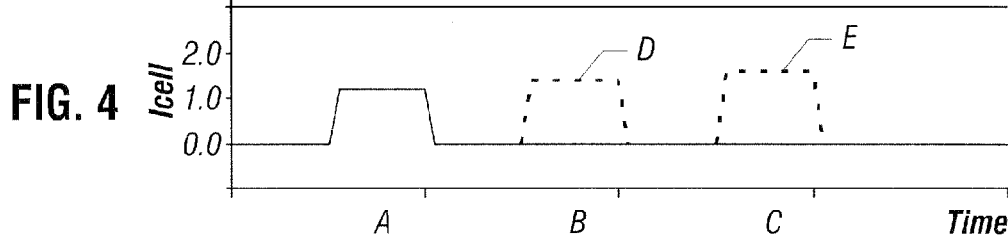
FIG. 4 is a graph of cell current over time in accordance with one embodiment of the present invention.

An example of possible waveforms is shown in FIGS. 2-4 with arbitrary scales on both the x and y axes. The first pulse, shown at time A in FIG. 4, need not threshold the cell. If the cell does not threshold, it means that it already has a high enough threshold voltage. This can avoid unnecessarily resetting cells that are already reset.

Subsequent current pulses D and E can occur at times B and C as needed. These pulses may be considered as conditional in that they only occur if the preceding pulse(s) did not program the threshold voltage of the cell above the corresponding transistor 18 source voltage.

The transistor 18 gate voltage pulses are shown in decreasing magnitude at times A-C in FIG. 2. Specifically, FIG. 2 shows the voltage applied to the gate of the transistor 18 at times A, B, and C and FIG. 3 shows the voltage applied to the gate of the transistor 22 at times A, B, and C in one example. Thus, as an example, the gate voltage applied to the transistor 18 gate decreases with time, while the voltage applied to the transistor 22 gate increases with time. This increasing and decreasing magnitude is not necessary but may lend confidence that a cell is not disturbed to a lower threshold voltage when a voltage is applied and no pulse occurs. Each sequential programming pulse is shown as developing increasing current $I_{cell}$ in FIG. 4, but could also decrease or to change width or edge rate if the cell requires lower current or a different pulse shape for higher threshold voltages.

If the source follower transistor 18 has zero voltage drop, then the gate voltage of that transistor translates directly to the voltage on the top node of the cell 20. Similarly, the cell 20 may leak so little current that regardless of the value of the gate voltage of the transistor 22, the bottom node of the cell 20 is at ground. Under these conditions, the voltage across the cell during each VGtop pulse is the value of VGtop.

If VGtop at time A in FIG. 2 has a magnitude of 1.2 volts, then, according to FIG. 5, a cell with the I-V curve of FIG. 5 thresholds, regardless of its state. After thresholding, the cell conducts a current, as determined by the gate voltage VGbot of the bottom clamp transistor 22 in FIG. 1. Although FIG. 5 shows that with 1.2 volts across the cell, the current in the on state exceeds the range of the y axis, the extra voltage is absorbed by the bottom transistor 22 in saturation. Thus, according to FIGS. 2-4, the first pulse of VGbot is equal to 0.5, which allows a normalized programming current of 1.2 $I/I_{reset}$. This is enough to reset a typical cell.

The second VGtop pulse at time B, shown in FIG. 2, hypothetically has a magnitude of one volt. If the previous pulse (at time A) successfully reset the cell, then FIG. 5 indicates that one volt is not enough to threshold the cell. Thus, the programming current $I_{cell}$ does not flow. If, however, the previous pulse does reset the bit so that its threshold voltage is less than one volt, the second pulse does not threshold the bit and causes 1.4 $I/I_{reset}$ current to flow. Likewise, if 1.4 $I/I_{reset}$ is not enough, the third pulse at time C does threshold the cell and sends 1.6 $I/I_{rest}$ current into the cell.

Only a cell whose threshold voltage is below a certain value is selected and programmed. Therefore, some embodiments may be adapted to different threshold voltage programming tendencies. For example, if higher threshold voltage results from a lower magnitude or longer trailing current pulses, a current pulse shaping circuit or algorithm can be changed to provide such pulses after the cell enters the reset current regime. In addition, cells that have zero threshold voltage, because they exhibit snapback, even the set state may be utilized. In some embodiments, cells of this type may exhibit a better margin.

To maximize the read window for cells to be set, programming pulses may be applied to cells that fail to threshold above a certain value with inverted logic. A set pulse may be applied only after it has been determined that a cell did not threshold.

In some embodiments, the threshold voltage verification is completed during programming with no explicit sensing operation. The circuit and cell implicitly decide whether or not to deliver a reset pulse. This may simplify the circuitry and speed up the write operation in some embodiments. Typically, a write algorithm uses multiple write and verify iterations to ensure all cells are programmed to a minimum threshold voltage. Some embodiments allow more flexibility in the current magnitudes used in an algorithm, allowing it to handle a wider spread of cell performance or increase the write speed and bandwidth of a product.

In some embodiments, the write controller 12 will attempt to apply a given number of write pulses, regardless of whether they are needed. Thus, in some embodiments, the write controller may programmably apply two or more pulses. However, if the cell is already programmed, the attempt to provide the additional pulses will be futile. No pulse will be provided, but some time may be used in attempting to apply one or more additional pulses that are not needed. Thus, in some embodiments, the current detector 26 may be used to determine if current actually flows. If current does not flow, it can be determined that the cell is already programmed and it is not necessary to apply ensuing pulses. In some embodiments, this may shorten the programming time.

Figure 6:
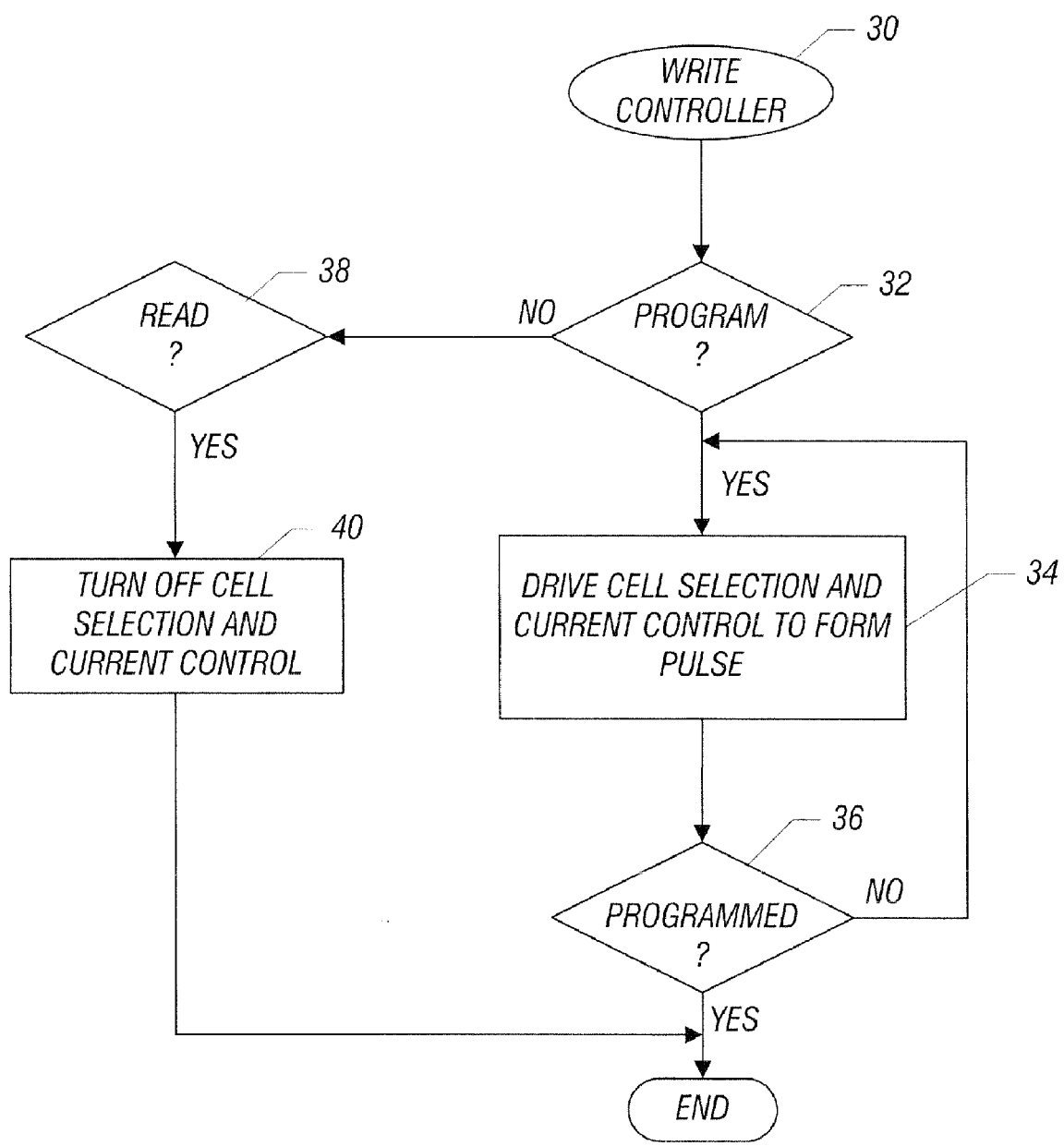
FIG. 6 is a flow chart for one embodiment.

Referring to FIG. 6, in accordance with some embodiments, the write controller 30 may implement a sequence to program the cell 22. This sequence may be implemented in software, hardware, or firmware in some embodiments. In some embodiments, the write controller may be a processor-based device that stores instructions in a suitable semiconductor storage device. When those instructions are executed, the write controller can cause a series of operations, described in FIG. 6, to occur. Thus, the write controller 12 or some other portion of the memory may include a computer readable medium storing instructions that, when executed, enable the controller to perform a sequence of operations.

Referring to FIG. 6, the write controller initially determines whether or not a program operation has been requested, for example, from an external memory controller or other processor. If not, a check at diamond 38 determines whether a read mode has been implemented. If a read mode is implemented, the transistors 18 and 22 may be turned off and the read circuit 24 may then be operated by other circuitry or code, as indicated in block 40.

If the programming mode has been implemented, as determined in diamond 32, initially, the cell selection 14 and current control 16 are driven to provide an appropriate pulse, as indicated in block 34. Thus, the cell may be programmed to an appropriate level. A check at diamond 36 determines whether or not the cell has been programmed to the appropriate level. In one embodiment this can be determined using the current detector 26. Namely, if no current flows, then the cell is already programmed and it is not necessary to apply additional programming pulses. Otherwise, another pulse is applied and the flow iterates.

A series connected select device may be used to access a memory element, including the phase change material, during programming or reading of memory element. The select device may be a threshold switch, such as an ovonic threshold switch, that can be made of a chalcogenide alloy that does not exhibit an amorphous to crystalline phase change and which undergoes rapid, electric field initiated change in electrical conductivity that persists only so long as a holding voltage is present.

A select device may operate as a switch that is either "off" or "on" depending on the amount of voltage potential applied across the memory cell, and more particularly whether the current through the select device exceeds its threshold current or voltage, which then triggers the device into the on state. The off state may be a substantially electrically nonconductive state and the on state may be a substantially conductive state, with less resistance than the off state.

In the on state, the voltage across the select device is equal to its holding voltage $V_H$ plus IxRon, where Ron is the dynamic resistance from the extrapolated X-axis intercept, $V_H$. For example, a select device may have threshold voltages and, if a voltage potential less than the threshold voltage of a select device is applied across the select device, then the select device may remain "off" or in a relatively high resistive state so that little or no electrical current passes through the memory cell and most of the voltage drop from selected row to selected column is across the select device. Alternatively, if a voltage potential greater than the threshold voltage of a select device is applied across the select device, then the select device may "turn on," i.e., operate in a relatively low resistive state so that electrical current passes through the memory cell. In other words, one or more series connected select devices may be in a substantially electrically nonconductive state if less than a predetermined voltage potential, e.g., the threshold voltage, is applied across select devices. Select devices may be in a substantially conductive state if greater than the predetermined voltage potential is applied across select devices. Select devices may also be referred to as an access device, an isolation device, or a switch.

In one embodiment, each select device may comprise a switching material such as, for example, a chalcogenide alloy, and may be referred to as an ovonic threshold switch, or simply an ovonic switch. The switching material of select devices may be a material in a substantially amorphous state positioned between two electrodes that may be repeatedly and reversibly switched between a higher resistance "off" state (e.g., greater than about ten megaOhms) and a relatively lower resistance "on" state (e.g., about one thousand Ohms in series with $V_H$) by application of a predetermined electrical current or voltage potential. In this embodiment, each select device may be a two terminal device that may have a current-voltage (I-V) characteristic similar to a phase change memory element that is in the amorphous state. However, unlike a phase change memory element, the switching material of select devices may not change phase. That is, the switching material of select devices may not be a programmable material, and, as a result, select devices may not be a memory device capable of storing information. For example, the switching material of select devices may remain permanently amorphous and the I-V characteristic may remain the same throughout the operating life.

In the low voltage or low electric field mode, i.e., where the voltage applied across select device is less than a threshold voltage (labeled $V_{TH}$), a select device may be "off" or non-conducting, and exhibit a relatively high resistance, e.g., greater than about 10 megaOhms. The select device may remain in the off state until a sufficient voltage, e.g., $V_{TH}$, is applied, or a sufficient current is applied, e.g., $I_{TH}$, that may switch the select device to a conductive, relatively low resistance on state. After a voltage potential of greater than about $V_{TH}$ is applied across the select device, the voltage potential across the select device may drop ("snapback") to a holding voltage potential, $V_H$. Snapback may refer to the voltage difference between $V_{TH}$ and $V_H$ of a select device.

In the on state, the voltage potential across select device may remain close to the holding voltage of $V_H$ as current passing through select device is increased. The select device may remain on until the current through the select device drops below a holding current, $I_H$. Below this value, the select device may turn off and return to a relatively high resistance, nonconductive off state until the $V_{TH}$ and $I_{TH}$ are exceeded again.

In some embodiments, only one select device may be used. In other embodiments, more than two select devices may be used. As another example, the threshold current of the memory element may be about equal to the threshold current of the access device even though its snapback voltage is greater than the memory element's reset bit threshold voltage.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   programming a phase change memory cell by applying, across the phase change memory cell, a voltage that has a level less than or equal to a desired phase change memory cell threshold voltage.

2. The method of claim 1 including applying successive pulses to said cell until said cell has the desired threshold voltage.

3. The method of claim 2 including programming said cell to a higher threshold voltage by applying a voltage in excess of the cell's threshold voltage.

4. The method of claim 3 including coupling the cell to a source follower.

5. The method of claim 4 including coupling the cell to a current mirror.

6. The method of claim 1 including forming said cell with a memory element in series with a thin film selector.

7. The method of claim 2 including supplying an increasing voltage difference across said cell.

8. The method of claim 1 including programming said cell without using any sensing of programmed state.

9. An apparatus comprising:
   a phase change memory cell; and
   a circuit to selectively supply a programming current to the phase change memory cell depending on whether or not the phase change memory cell has reached a desired programming threshold voltage level.

10. The apparatus of claim 9 wherein said cell is a memory cell exhibiting the threshold switch behavior.

11. The apparatus of claim 10 wherein said phase change memory includes a phase change memory element including a chalcogenide and a thin film selector in series with said memory element.

12. The apparatus of claim 9 wherein said circuit includes a first transistor above said cell and a second transistor below said cell.

13. The apparatus of claim 12 wherein said first transistor is biased as a source follower.

14. The apparatus of claim 13 wherein said second transistor is biased as a current mirror.

15. The apparatus of claim 9 wherein said circuit to supply an increasing voltage difference across the cell until said cell is programmed to the desired threshold level.

16. The apparatus of claim 9 wherein a verify cycle is not used after programming.

17. The apparatus of claim 9 wherein said circuit to supply successive pulses to said cell until said cell has reached the desired threshold voltage.

18. The apparatus of claim 9 wherein said circuit to program said cell to a higher threshold voltage by applying a voltage in excess of the cell's threshold voltage.

19. An apparatus comprising:
   a phase change memory cell; and
   a circuit to determine whether the cell has reached a desired threshold current and, if not, to automatically supply additional programming current.

20. The apparatus of claim 19 wherein said cell includes a chalcogenide memory element and a thin film selector in series with said memory element.

21. The apparatus of claim 19 including a first transistor biased as a source follower connected between said cell and a power supply.

22. The apparatus of claim 21 including a second transistor between said cell and ground, said second transistor biased as a current mirror.

23. The apparatus of claim 19, said circuit to supply an increasing voltage difference across said cell until said cell is programmed to the desired threshold level.

* * * * *